(12) United States Patent
Yoshimori

(10) Patent No.: US 12,093,766 B2
(45) Date of Patent: Sep. 17, 2024

(54) MODULE

(71) Applicant: Murata Manufacturing Co., Ltd., Nagaokakyo (JP)

(72) Inventor: Hiroki Yoshimori, Nagaokakyo (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 583 days.

(21) Appl. No.: 17/380,212

(22) Filed: Jul. 20, 2021

(65) Prior Publication Data

US 2021/0350196 A1 Nov. 11, 2021

Related U.S. Application Data

(63) Continuation of application No. PCT/JP2020/001863, filed on Jan. 21, 2020.

(30) Foreign Application Priority Data

Jan. 30, 2019 (JP) ................................. 2019-014605

(51) Int. Cl.
*H04B 5/77* (2024.01)
*G06K 7/10* (2006.01)
*G06K 19/07* (2006.01)
*H01L 23/552* (2006.01)
*H05K 9/00* (2006.01)

(52) U.S. Cl.
CPC ..... *G06K 19/0723* (2013.01); *G06K 7/10079* (2013.01); *H01L 23/552* (2013.01); *H04B 5/77* (2024.01); *H05K 9/00* (2013.01); *H01L 2223/6661* (2013.01)

(58) Field of Classification Search
CPC ........... H01L 23/552; H01L 2223/6661; H01L 28/00; G06K 19/552
See application file for complete search history.

(56) References Cited

U.S. PATENT DOCUMENTS

2009/0195359 A1* 8/2009 Koyama ............ G06K 19/0723
340/10.1

FOREIGN PATENT DOCUMENTS

| JP | H01-156071 U | 10/1989 | |
|---|---|---|---|
| JP | 2002032731 A * | 1/2002 | ........... G06K 19/072 |
| JP | 2006-105832 A | 4/2006 | |

(Continued)

OTHER PUBLICATIONS

International Search Report for PCT/JP2020/001863 dated Mar. 31, 2020.
Written Opinion for PCT/JP2020/001863 dated Mar. 31, 2020.

*Primary Examiner* — Walter H Swanson
*Assistant Examiner* — Jacob T Nelson
(74) *Attorney, Agent, or Firm* — Pearne & Gordon LLP

(57) ABSTRACT

A module (101) includes: a substrate (1) having a first main surface (1a); a first sealing resin (6a) disposed to cover the first main surface (1a); a shielding film (8) that covers an upper surface and a side surface of the first sealing resin (6a); and two or more RFID tags (41, 42) sealed in the first sealing resin (6a) with the two or more RFID tags (41, 42) being not electrically connected to the substrate (1). The two or more RFID tags (41, 42) are disposed such that communication surfaces of the two or more RFID tags (41, 42) are oriented in different directions. The shielding film (8) is provided with an opening or notch at a portion facing each of the communication surfaces of the two or more RFID tags (41, 42).

11 Claims, 13 Drawing Sheets

(56) References Cited

FOREIGN PATENT DOCUMENTS

| | | | |
|---|---|---|---|
| JP | 2007-096940 A | 4/2007 | |
| JP | 2007-288341 A | 11/2007 | |
| JP | 2009-205669 A | 9/2009 | |
| JP | 2014146624 A * | 8/2014 | ............. H01L 24/97 |

* cited by examiner

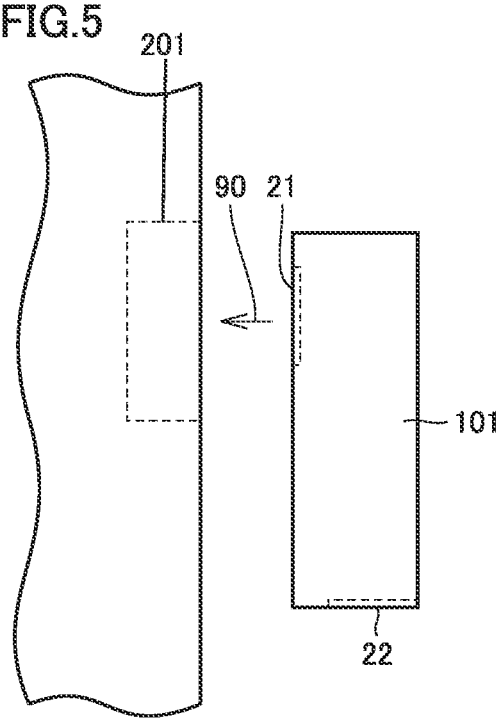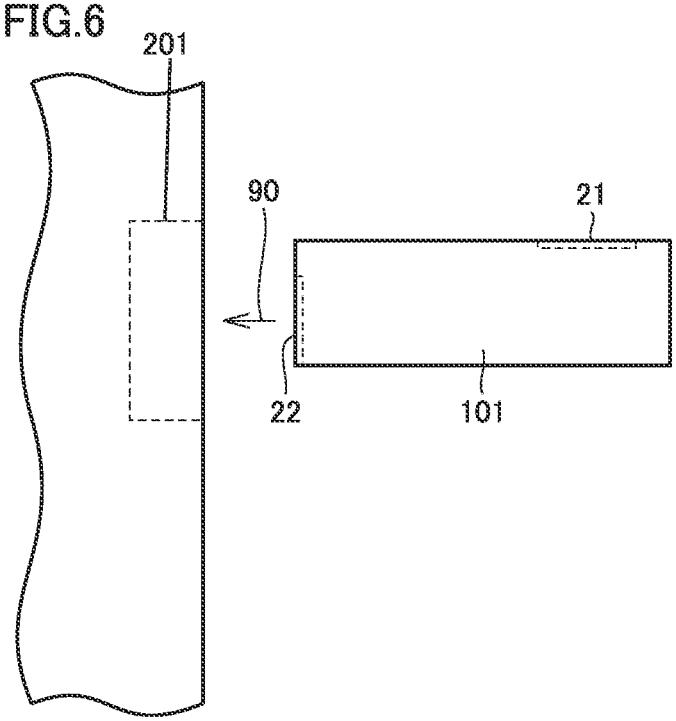

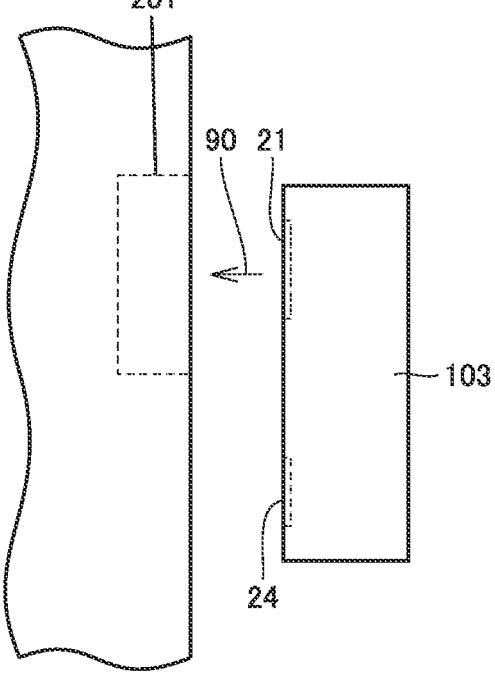
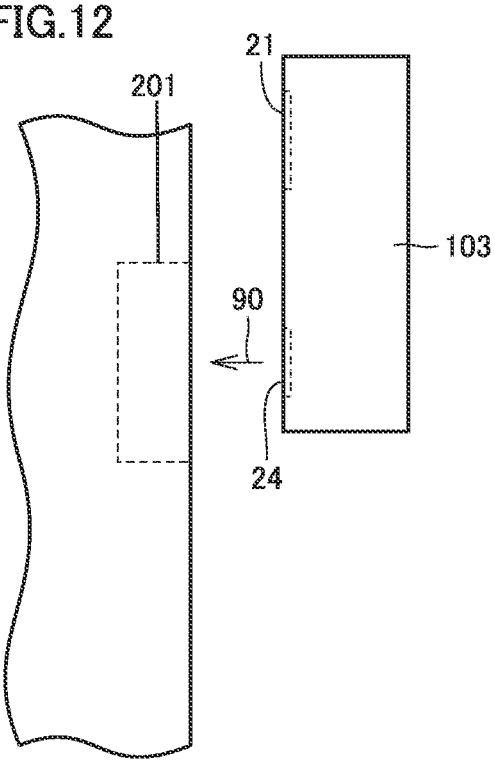

MODULE

CROSS REFERENCE TO RELATED APPLICATION

This is a continuation of International Application No. PCT/JP2020/001863 filed on Jan. 21, 2020 which claims priority from Japanese Patent Application No. 2019-014605 filed on Jan. 30, 2019. The contents of these applications are incorporated herein by reference in their entireties.

BACKGROUND OF THE DISCLOSURE

Field of the Disclosure

The present disclosure relates to a module.

Description of the Related Art

An exemplary module having a shielding layer is described in Japanese Patent Laid-Open No. 2014-146624 (PTL 1). In PTL 1, one of the electronic components mounted on a circuit board has a function of transmitting and receiving electric waves. Above the electronic component, an opening is provided in a shielding layer. PTL 1 describes that by thus providing the opening, the electronic component can transmit and receive electric waves.

PTL 1: Japanese Patent Laid-Open No. 2014-146624

BRIEF SUMMARY OF THE DISCLOSURE

Such an electronic component having a function of transmitting and receiving electric waves is, for example, an RFID tag. In recent years, an amount of information handled by an electronic device has been increased and it has been required to provide a plurality of RFID tags in one module and allow the plurality of RFID tags to perform communications individually. However, when the plurality of RFID tags are disposed at positions close to each other, it is difficult to perform communications individually, with the result that information may be unable to be precisely read. In the configuration described in PTL 1, it is difficult to dispose a plurality of RFID tags of the same frequency, for example.

Therefore, an object of the present disclosure is to provide a module in which a plurality of RFID tags can be provided in a small space and can perform communications independently.

To achieve the object, a module according to the present disclosure includes: a substrate having a first main surface; a first sealing resin disposed to cover the first main surface; a shielding film that covers an upper surface and a side surface of the first sealing resin; and two or more RFID tags sealed in the first sealing resin with the two or more RFID tags being not electrically connected to the substrate, wherein the two or more RFID tags are disposed such that communication surfaces of the two or more RFID tags are oriented in different directions, and the shielding film is provided with an opening or notch at a portion facing each of the communication surfaces of the two or more RFID tags.

According to the present disclosure, there can be realized a module in which a plurality of RFID tags can be provided in a small space and can perform communications independently.

BRIEF DESCRIPTION OF THE SEVERAL VIEWS OF THE DRAWINGS

FIG. 5 is an explanatory diagram of a first usage example of the module in the first embodiment according to the present disclosure.

FIG. 6 is an explanatory diagram of a second usage example of the module in the first embodiment according to the present disclosure.

FIG. 11 is an explanatory diagram of a first usage example of the module in the second embodiment according to the present disclosure.

FIG. 12 is an explanatory diagram of a second usage example of the module in the second embodiment according to the present disclosure.

DETAILED DESCRIPTION OF THE DISCLOSURE

Dimensional ratios shown in figures do not necessarily represent actual dimensions faithfully, and may be exaggerated for convenience of description. In the description below, when reference is made to the concepts "upward" or "downward" do not necessarily mean the absolute "upward" or "downward" direction, but may mean a relative "upward" or "downward" direction in a pose shown in each figure.

First Embodiment

A module in a first embodiment according to the present disclosure will be described with reference to FIGS. 1 to 4.

Figure 1:
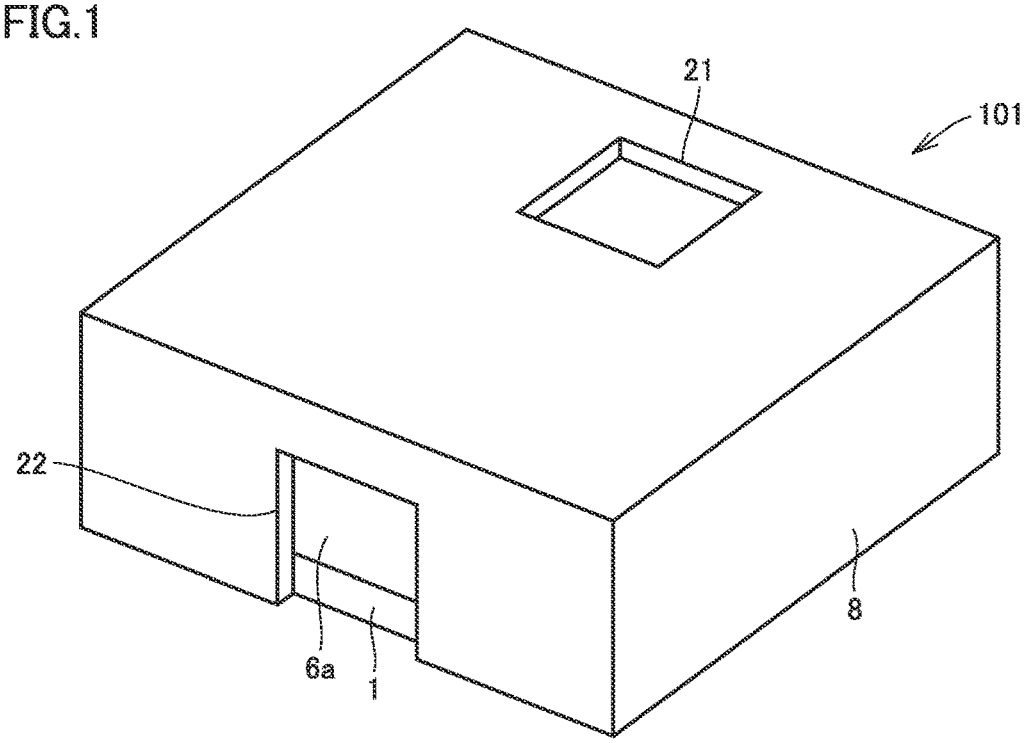
FIG. 1 is a perspective view of a module in a first embodiment according to the present disclosure.
Figure 2:
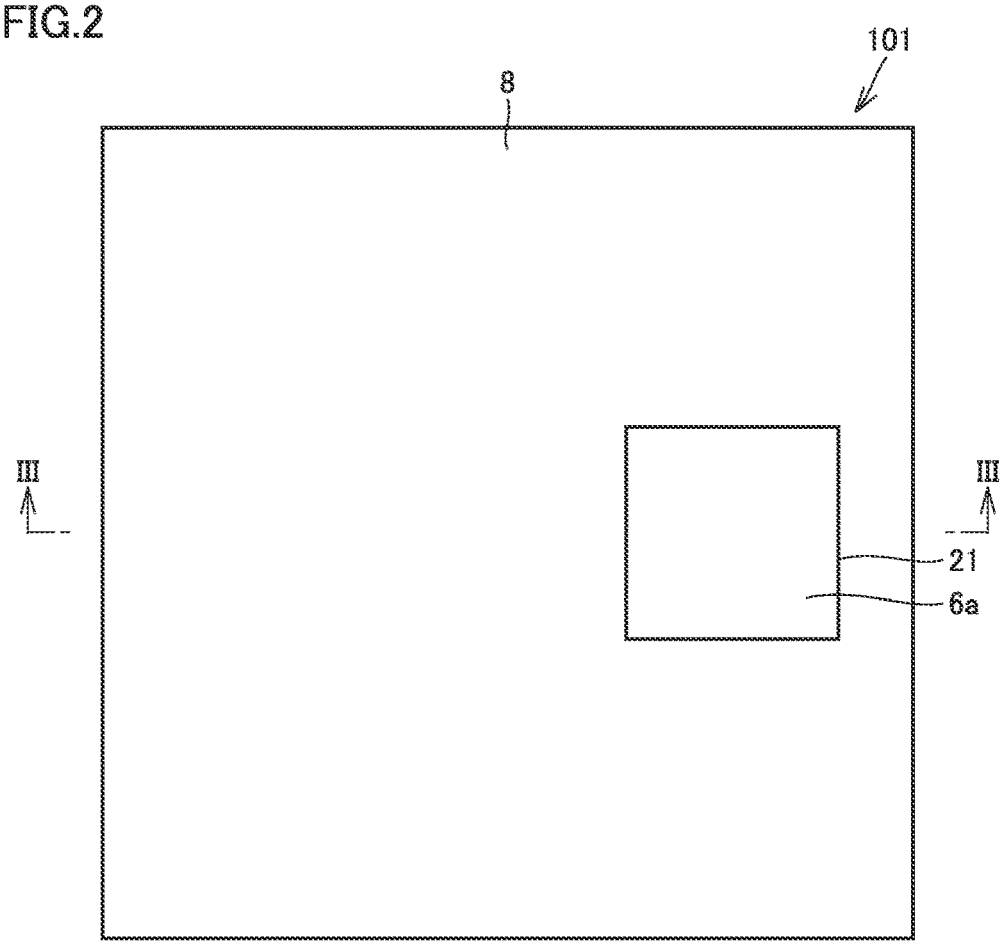
FIG. 2 is a plan view of the module in the first embodiment according to the present disclosure.
Figure 3:
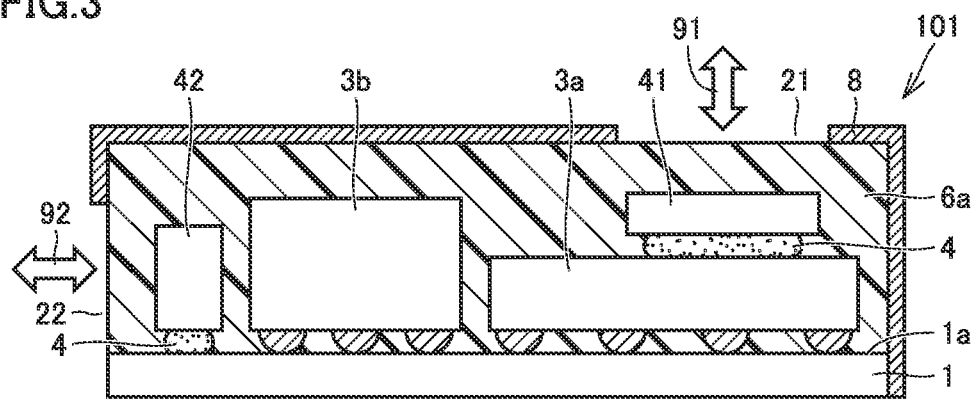
FIG. 3 is a cross sectional view taken along a line in FIG. 2.

FIG. 1 shows a perspective view of a module 101 in the present embodiment. FIG. 2 shows a plan view of module 101. FIG. 3 shows a cross sectional view taken along a line in FIG. 2.

Figure 4:
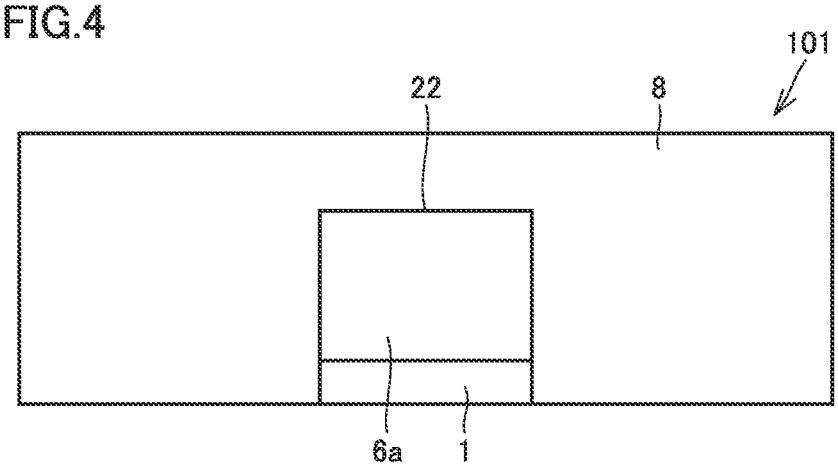
FIG. 4 is a side view of the module in the first embodiment according to the present disclosure.

Module 101 in the present embodiment includes: a substrate 1 having a first main surface 1a; a first sealing resin 6a disposed to cover first main surface 1a; a shielding film 8 that covers an upper surface and a side surface of first sealing resin 6a; and a plurality of RFID tags 41, 42 sealed in first sealing resin 6a with the plurality of RFID tags 41, 42 being not electrically connected to substrate 1. In other words, the plurality of RFID tags 41, 42 are two or more RFID tags. The plurality of RFID tags 41, 42 are disposed such that communication surfaces of the plurality of RFID tags 41, 42 are oriented in different directions. In the example shown here, RFID tag 41 is installed to be oriented in an upward direction, whereas RFID tag 42 is installed to be oriented in a lateral direction. Shielding film 8 is provided with an opening or notch at a portion facing each of the communication surfaces of the plurality of RFID tags 41, 42. As an example of the "opening or notch", shielding film 8 of module 101 is provided with an opening 21 in an upper surface of shielding film 8 and is provided with a notch 22 in a side surface of shielding film 8. Through the opening or notch, input and output signals pass. FIG. 4 shows module 101 when viewed in a direction in which the side surface of shielding film 8 provided with notch 22 is located on the front side. Opening 21 is provided at a position corresponding to RFID tag 41, that is, at a portion facing the communication surface of RFID tag 41. Notch 22 is provided at a position corresponding to RFID tag 42, that is, at a portion facing the communication surface of RFID tag 42. It should be noted that each RFID tag includes: an IC chip that holds predetermined information and that performs a process onto a predetermined wireless signal; and an antenna element that transmits and receives high-frequency signals.

In module 101, components 3a, 3b are mounted on first main surface 1a of substrate 1. Component 3a is lower in height than component 3b. RFID tag 41 is adhered to the upper surface of component 3a through an adhesive agent 4. RFID tag 41 is not electrically connected to component 3a. RFID tag 42 is adhered to first main surface 1a of substrate 1 through adhesive agent 4. RFID tag 42 is not electrically connected to substrate 1.

In the present embodiment, the plurality of RFID tags 41, 42 are disposed such that the communication surfaces of the plurality of RFID tags 41, 42 are oriented in different directions, and the opening or notch through which input and output signals are to pass is provided in shielding film 8 at the portion facing each of the communication surfaces of the RFID tags. Thus, RFID tags 41, 42 can perform communications independently without interfering with each other. Although only an example is shown here, RFID tag 41 can perform transmission and reception through opening 21 as indicated by an arrow 91. RFID tag 42 can perform transmission and reception through notch 22 as indicated by an arrow 92.

Each of RFID tags 41, 42 is preferably a passive type RFID tag. In this case, these RFID tags do not require electric coupling. Therefore, a degree of freedom in installation location of each of these RFID tags is high, thereby achieving space saving.

Thus, in the present embodiment, there can be realized a module in which a plurality of RFID tags can be provided in a small space and can perform communications independently.

Usage Example

A usage example of module 101 will be described with reference to FIGS. 5 and 6. In the example shown here, a reading device 201 is held on a wall or the like. The user holds module 101 and brings opening 21 to be close to reading device 201 as shown in FIG. 5. In this way, communication by RFID tag 41 behind opening 21 is performed. On the other hand, when communication by RFID tag 42 should be performed, notch 22 is brought to be close to reading device 201 as shown in FIG. 6. In this way, communication by RFID tag 42 behind notch 22 is performed.

Module 101 in the present embodiment includes the plurality of RFID tags; however, by changing the posture of module 101 when being brought to be close to reading device 201 as shown in FIGS. 5 and 6, communication relating to one purpose intentionally selected by the user can be performed.

Modification

Figure 7:
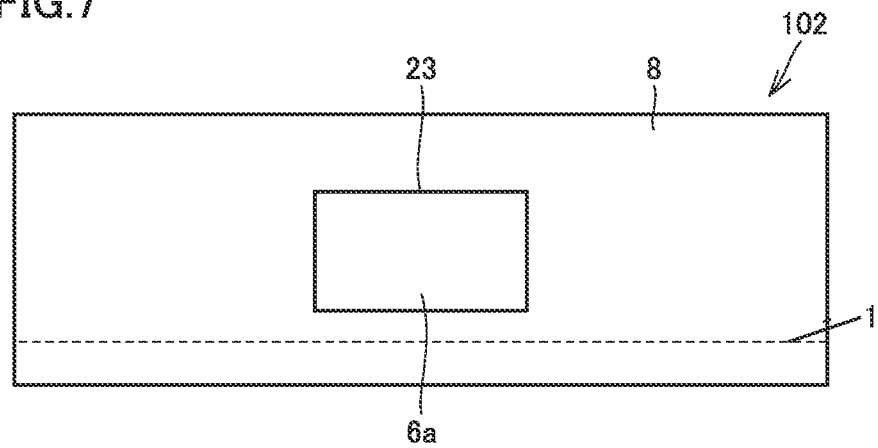
FIG. 7 is a side view of a modification of the module in the first embodiment according to the present disclosure.

A modification of the module in the first embodiment according to the present disclosure will be described with reference to FIG. 7.

In module 101 in the first embodiment, notch 22 shaped to reach the lower end of the side surface is provided so as to correspond to RFID tag 42, but this is merely an example. For example, as in a module 102 shown in FIG. 7, an opening 23 may be provided in a side surface. Opening 23 is located at a position separated from both the upper and lower ends of the side surface.

Second Embodiment

Figure 8:
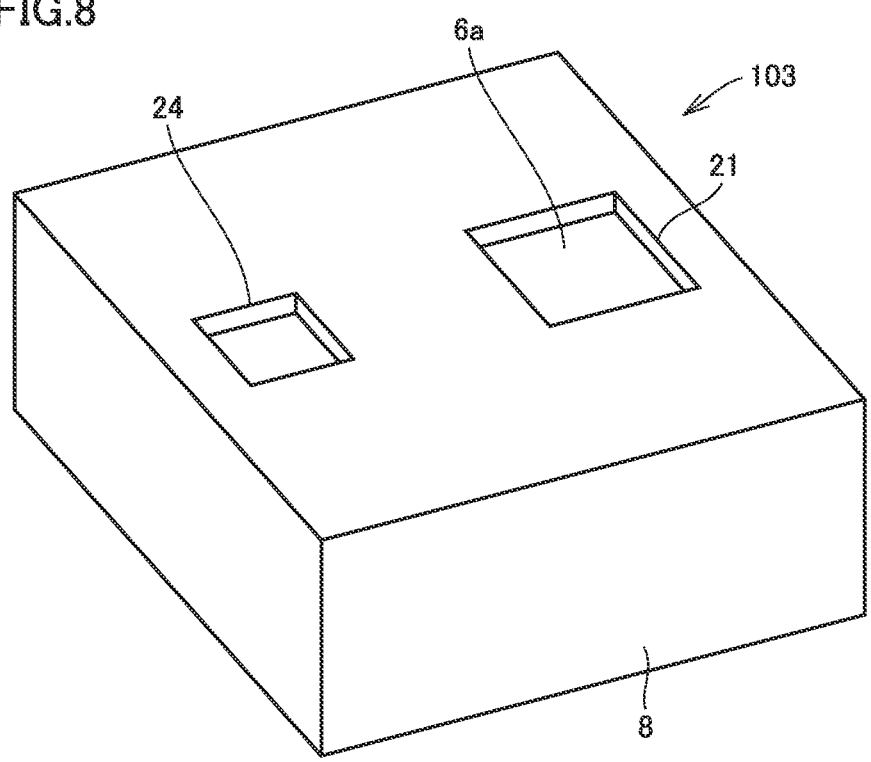
FIG. 8 is a perspective view of a module in a second embodiment according to the present disclosure.
Figure 9:
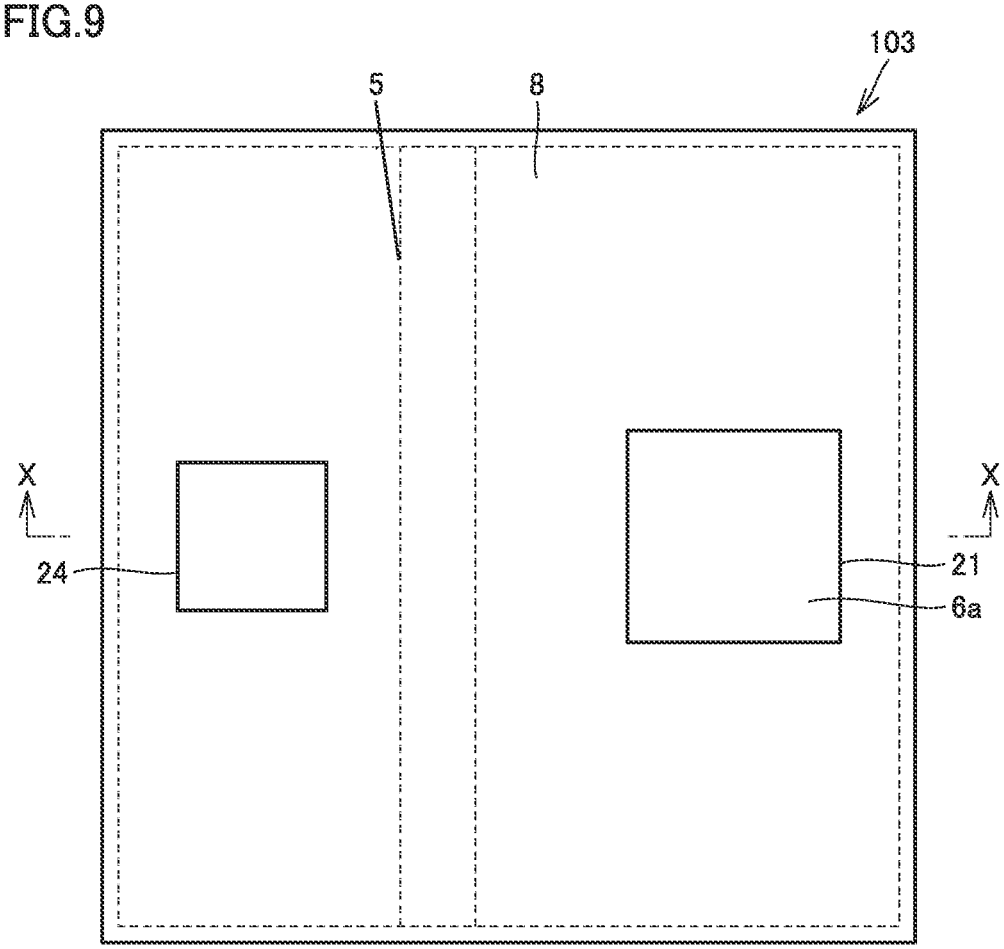
FIG. 9 is a plan view of the module in the second embodiment according to the present disclosure.
Figure 10:
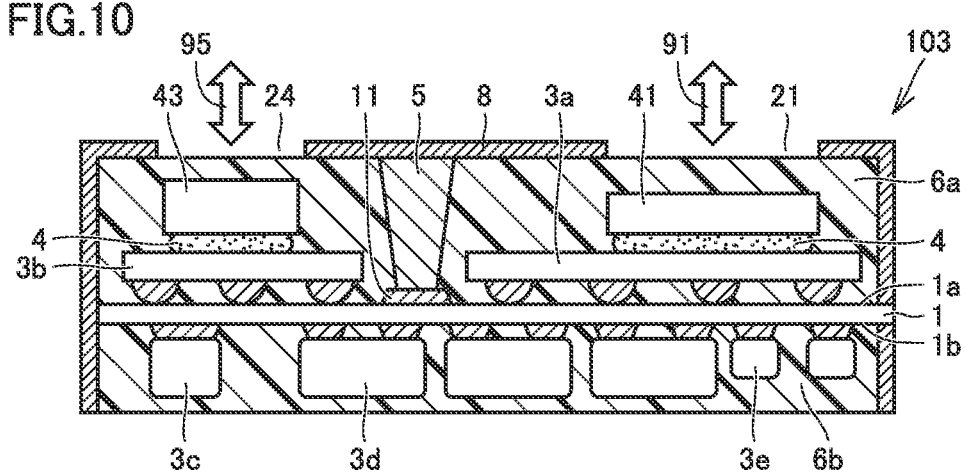
FIG. 10 is a cross sectional view taken along an X-X line in FIG. 9.

A module in a second embodiment according to the present disclosure will be described with reference to FIGS. 8 to 10. FIG. 8 shows a perspective view of a module 103 in the present embodiment. FIG. 9 shows a plan view of module 103. FIG. 10 shows a cross sectional view taken along an X-X line in FIG. 9.

Module 103 includes: a substrate 1 having a first main surface 1a; a first sealing resin 6a disposed to cover first main surface 1a; a shielding film 8 that covers an upper surface and a side surface of first sealing resin 6a; two or more RFID tags 41, 43 sealed in first sealing resin 6a with two or more RFID tags 41, 43 being not electrically connected to substrate 1; and a shielding wall 5 provided to stand on first main surface 1a between two or more RFID tags 41, 43. Shielding film 8 is provided with openings 21, 24 at portions facing the communication surfaces of two or more RFID tags 41, 43.

Substrate 1 has a second main surface 1b as a surface opposite to first main surface 1a. Components 3a, 3b are mounted on first main surface 1a. Components 3c, 3d, 3e are mounted on second main surface 1b. A second sealing resin 6b is disposed to cover components 3c, 3d, 3e on second main surface 1b. Shielding film 8 also covers the side surface of second sealing resin 6b.

Shielding wall 5 is composed of a conductive material. Shielding wall 5 may be composed of copper, for example. Shielding wall 5 is formed to be connected to the upper surface of a conductor layer 11 formed on first main surface 1a. Shielding wall 5 is provided to electromagnetically shield RFID tags 41, 43 from each other. Shielding wall 5 is also connected to shielding film 8. Shielding wall 5 may not have a constant thickness. In the example shown in FIG. 10, the thickness of shielding wall 5 is the thinnest at the lower end thereof, and is increased toward the upper side thereof. Conductor layer 11 is preferably grounded.

RFID tag 41 is adhered to the upper surface of component 3a through an adhesive agent 4. RFID tag 41 is not electrically connected to component 3a. RFID tag 43 is adhered to the upper surface of component 3b through adhesive agent 4. RFID tag 43 is not electrically connected to component 3b.

Also, in the present embodiment, the same effect as that in the first embodiment can be obtained. Since the opening through which input and output signals are to pass is provided in shielding film 8 at the portion facing each of the communication surfaces of the RFID tags and shielding wall 5 is provided to electromagnetically shield the RFID tags from each other, RFID tags 41, 43 can perform communications independently without interfering with each other. Although only an example is shown here, RFID tag 41 can perform transmission and reception through opening 21 as indicated by an arrow 91. RFID tag 43 can perform transmission and reception through opening 24 as indicated by an arrow 95.

The two or more RFID tags in each of the first and second embodiments may have the same corresponding frequency. In each of the first and second embodiments, even though the plurality of RFID tags of the same frequency are provided, the RFID tags can be used in a distinguishable manner without interfering with each other, which is advantageous in handling a large amount of information. This also applies to the following embodiments. It should be noted that all the two or more RFID tags do not need to correspond to the same frequency, and may include an RFID tag corresponding to a different frequency.

Usage Example

A usage example of module 103 will be described with reference to FIGS. 11 and 12. In the example shown here, a reading device 201 is held on a wall or the like. A user holds module 103 and brings opening 21 to be close to reading device 201 as shown in FIG. 11. In this way, communication by RFID tag 41 behind opening 21 is performed. On the other hand, when communication by RFID tag 43 should be performed, opening 24 is brought to be close to reading device 201 as shown in FIG. 12. In this way, communication by RFID tag 43 behind opening 24 is performed.

Module 103 in the present embodiment includes the plurality of RFID tags; however, by selecting which portion of module 103 is to be brought to be close to reading device 201 when bringing module 103 to be close to reading device 201 as shown in FIGS. 11 and 12, communication relating to one purpose intentionally selected by the user can be performed.

Third Embodiment

Figure 13:
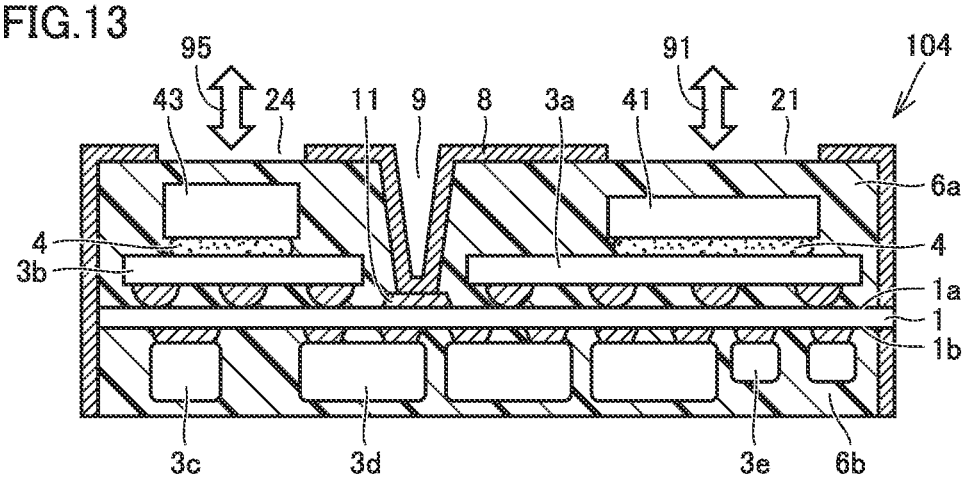
FIG. 13 is a cross sectional view of a module in a third embodiment according to the present disclosure.

A module in a third embodiment according to the present disclosure will be described with reference to FIG. 13. FIG. 13 shows a cross sectional view of a module 104 in the present embodiment. A shielding wall may have a solid wall-like structure composed of a conductor such as shielding wall 5 shown in the second embodiment, but may have a structure in which a conductor film is formed to cover an inner surface of a groove 9 provided in a first sealing resin 6a as shown in the present embodiment.

Also, in the present embodiment, the same effect as that in the second embodiment can be obtained.

Modifications of Shielding Wall

The second embodiment illustrates exemplary shielding wall 5 formed to completely extend from one side surface to the other side surface in the module as shown in FIG. 9. However, many modifications of the structure of the shielding wall are conceivable.

Figure 14:
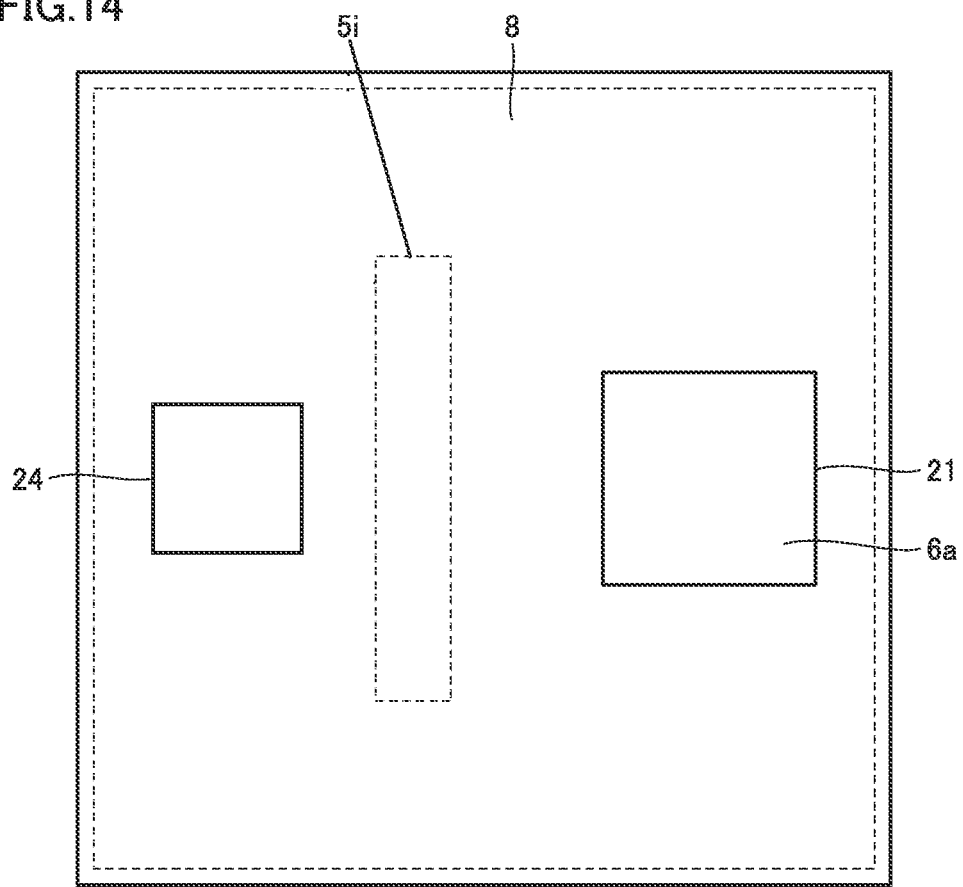
FIG. 14 is a plan view of a module to illustrate a first modification of a shielding wall.

A first modification may be a shielding wall 5i shown in FIG. 14, for example. Shielding wall 5i is a straight wall. Neither one of the ends of shielding wall 5i reaches the ends of the module. In FIG. 14, one RFID tag is disposed behind opening 21, and another RFID tag is disposed behind opening 24. The length of shielding wall 5i is shorter than one side of the module. When viewed from the RFID behind opening 21, the RFID behind opening 24 is out of sight and cannot be seen due to shielding wall 5i. The same applies when viewed from the RFID behind opening 24. Even with such a shielding wall having a limited length, it is effective in preventing interference between the RFID tags.

Figure 15:
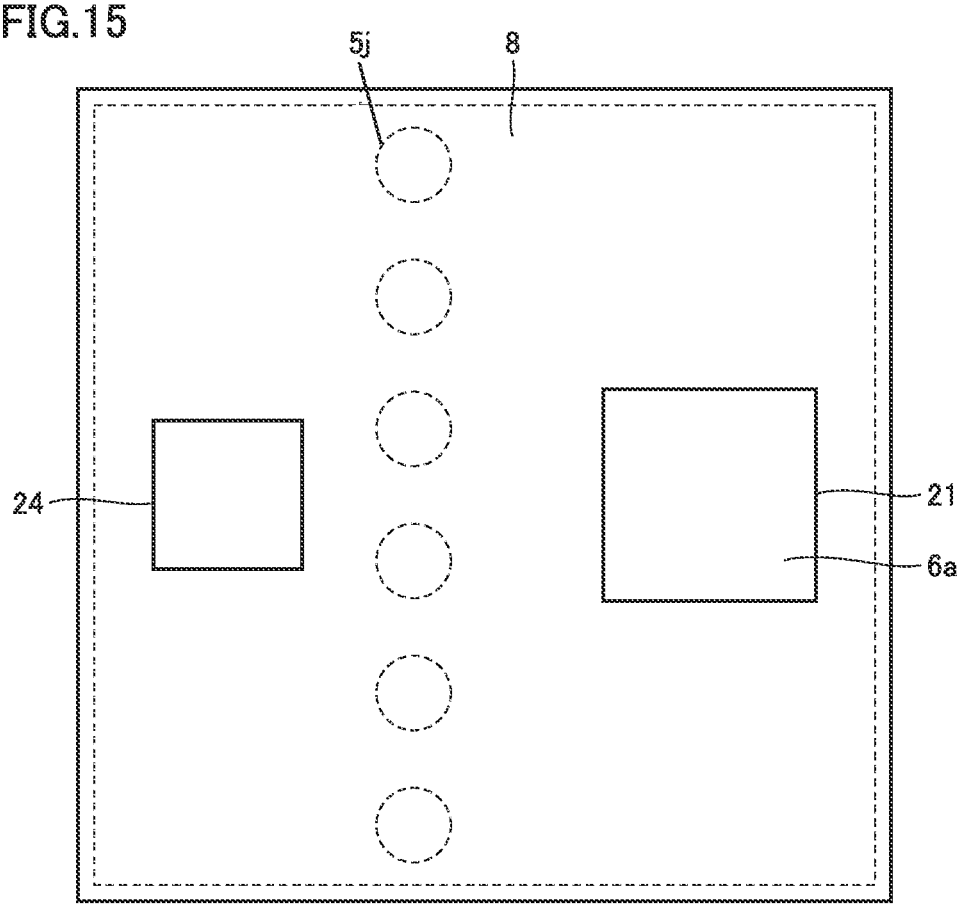
FIG. 15 is a plan view of a module to illustrate a second modification of the shielding wall.

A second modification may be a shielding wall 5j shown in FIG. 15, for example. Shielding wall 5j is a collection of a plurality of pillar-shaped conductors. Shielding wall 5j is formed by arranging a plurality of pillar-shaped conductors in the form of a dotted line. In FIG. 15, each of the pillar-shaped conductors of shielding wall 5j is shown as having a cylindrical shape, but is not limited to the cylindrical shape and may have another shape. As the second modification, the shielding wall may be any shielding wall as long as electromagnetic shielding can be attained by arranging conductors in an intermittent manner. The shielding wall may be formed by intermittently arranged wires. Even with such an intermittently arranged shielding wall, interference between the RFID tags can be prevented as long as an appropriate condition is satisfied, such as a condition that the components of the shielding wall are arranged at a pitch of less than or equal to a certain value. The expression "pitch of less than or equal to a certain value" here means, for example, a pitch that is ¼ time or less as large as the wavelength of an electromagnetic wave used for communication.

Figure 16:
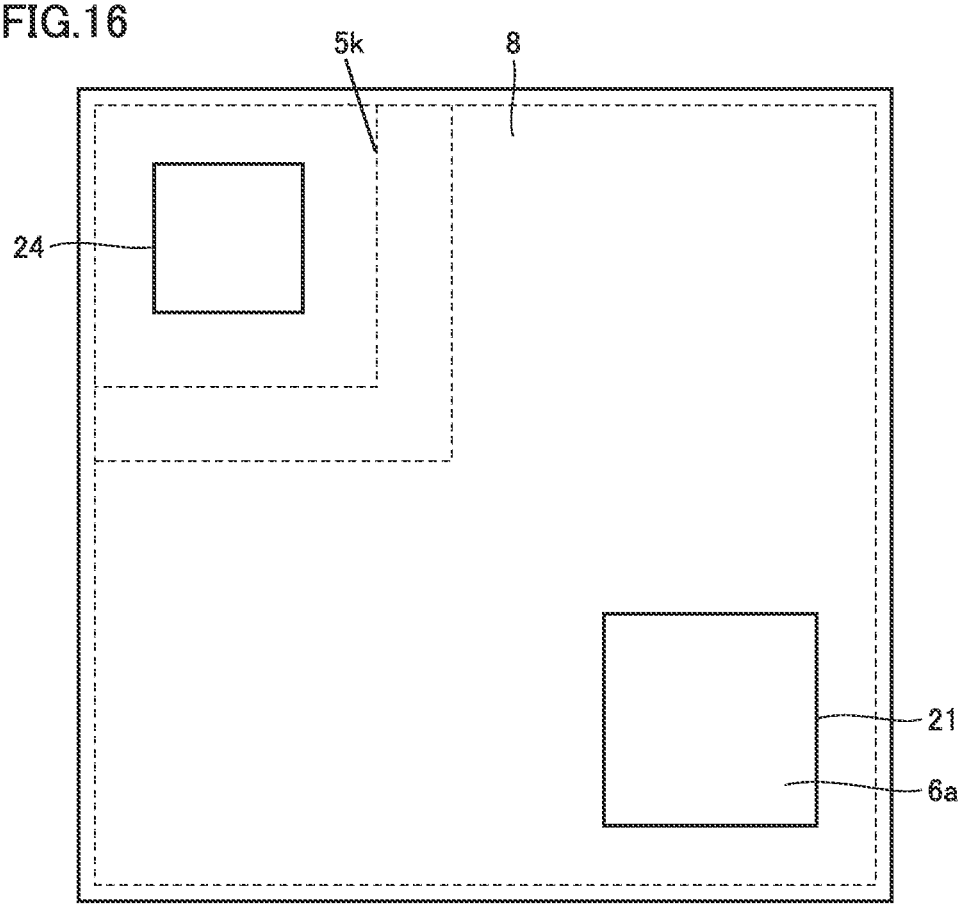
FIG. 16 is a plan view of a module to illustrate a third modification of the shielding wall.

A third modification may be a shielding wall 5k shown in FIG. 16, for example. Although shielding wall 5 shown in FIG. 9 is shaped to extend in a straight line, shielding wall 5k shown in FIG. 16 extends in the form of L. Shielding wall 5k is disposed to separate opening 24 from the other regions, in the vicinity of one corner of the module. An RFID tag is disposed behind opening 24. Both ends of shielding wall 5k are connected to two adjacent sides of the module when the module is viewed in a plan view. By employing such a shielding wall, it is advantageous in electromagnetically shielding a specific RFID tag from the other regions.

Fourth Embodiment

Figure 17:
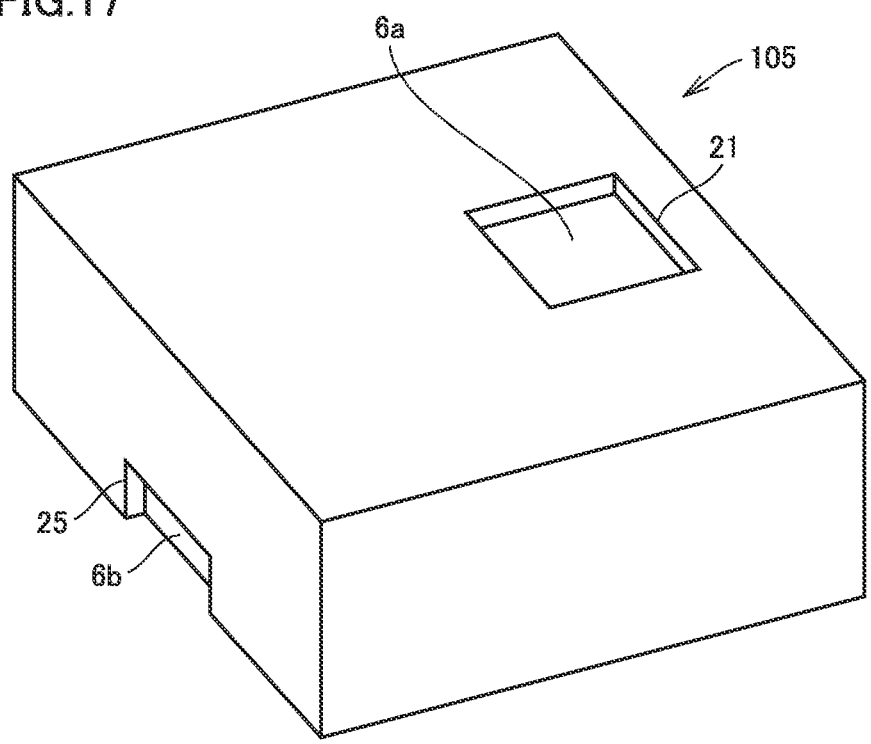
FIG. 17 is a perspective view of a module in a fourth embodiment according to the present disclosure.
Figure 18:
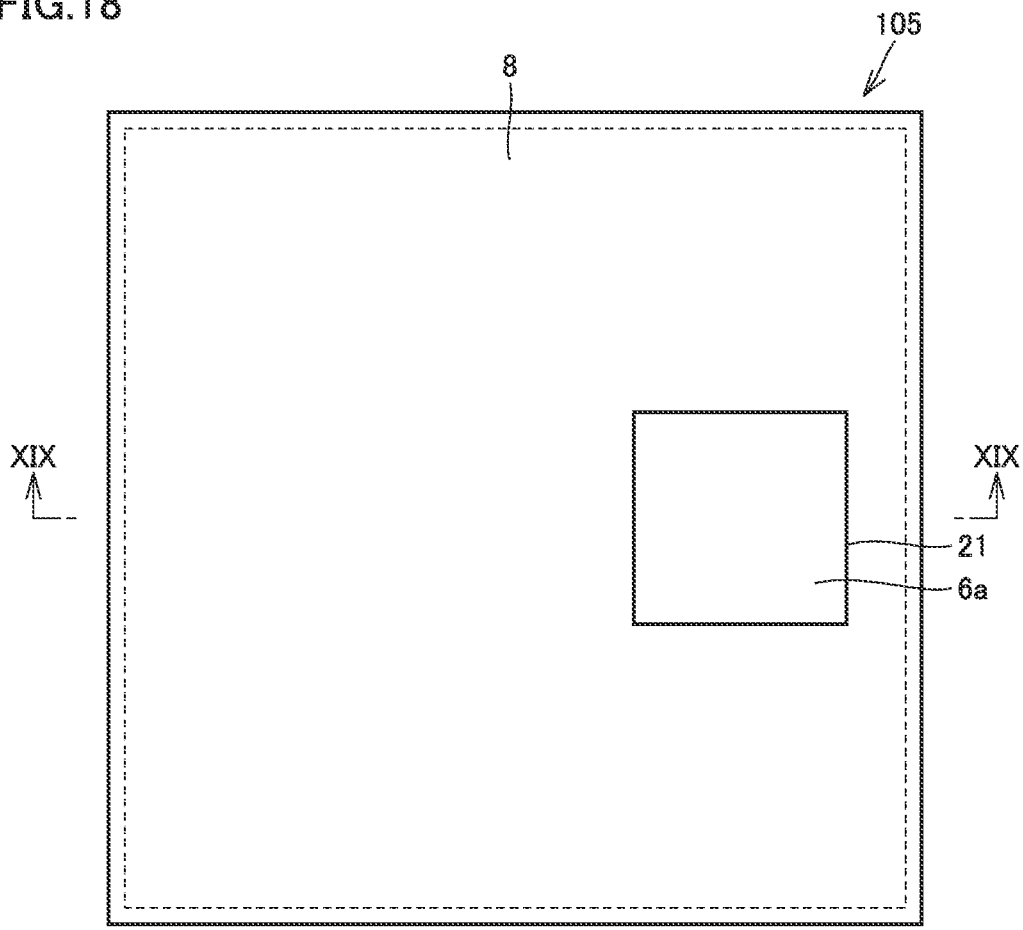
FIG. 18 is a plan view of a module in a fourth embodiment according to the present disclosure.
Figure 19:
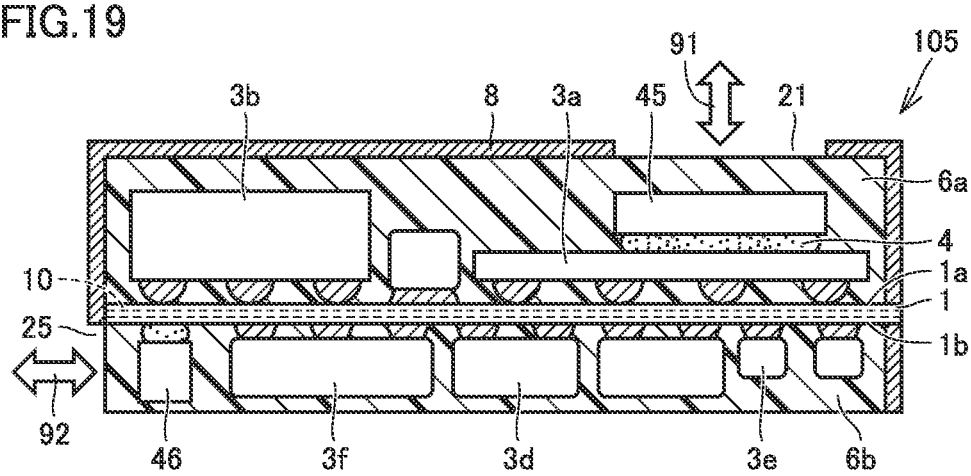
FIG. 19 is a cross sectional view taken along an XIX-XIX line in FIG. 18.

A module in a fourth embodiment according to the present disclosure will be described with reference to FIG. 17. FIG. 17 shows a perspective view of a module 105 in the present embodiment. In module 105, shielding film 8 is provided with an opening 21 in the upper surface of shielding film 8 and is provided with a notch 25 in the side surface of shielding film 8. A first sealing resin 6a is exposed from opening 21. A second sealing resin 6b is exposed from notch 25. FIG. 18 shows a plan view of module 105. FIG. 19 shows a cross sectional view taken along an XIX-XIX line in FIG. 18.

Module 105 includes a substrate 1. Substrate 1 has a first main surface 1a and a second main surface 1b. A GND layer 10 is included in substrate 1. GND layer 10 is grounded. Module 105 includes: a first sealing resin 6a disposed to cover first main surface 1a; a second sealing resin 6b disposed to cover second main surface 1b; a shielding film 8 that covers at least an upper surface and a side surface of first sealing resin 6a and a side surface of second sealing resin 6b; a passive type first RFID tag 45 sealed in first sealing resin 6a with first RFID tag 45 being not electrically connected to substrate 1; and a passive type second RFID tag 46 sealed in second sealing resin 6b with second RFID tag 46 being not electrically connected to substrate 1. First RFID tag 45 and second RFID tag 46 are electromagnetically shielded from each other by GND layer 10. Shielding film 8 is provided with an opening or notch, through which input and output signals are to pass, at a portion facing each of the communication surfaces of first RFID tag 45 and second RFID tag 46. As an example of the "opening or notch", shielding film 8 of module 105 is provided with opening 21 in the upper surface of shielding film 8 and is provided with notch 25 in the side surface of shielding film 8.

In module 105, components 3a, 3b are mounted on the first main surface of substrate 1. Component 3a is lower in height than component 3b. First RFID tag 45 is adhered to the upper surface of component 3a through an adhesive agent 4. First RFID tag 45 is not electrically connected to component 3a. Second RFID tag 46 is adhered to second main surface 1b of substrate 1 through adhesive agent 4. Second RFID tag 46 is not electrically connected to substrate 1.

Also, in the present embodiment, since GND layer 10 included in substrate 1 serves to provide electromagnetic shielding between the RFIDs, the same effect as those in the first embodiment and the like can be obtained. First RFID tag 45 can perform transmission and reception through opening 21 as indicated by an arrow 91. Second RFID tag 46 can perform transmission and reception through notch 25 as indicated by an arrow 92.

First RFID tag 45 and second RFID tag 46 may have the same corresponding frequency. In the fourth embodiment, even though the plurality of RFID tags of the same frequency are provided, the plurality of RFID tags are shielded from each other by GND layer 10 between one surface and the other surface of substrate 1 and the RFID tags can be used in a distinguished manner without interfering with each other, which is advantageous in handling a large amount of information.

Each of first RFID tag 45 and second RFID tag 46 is preferably a passive type RFID tag. In this case, these RFID tags do not require electric coupling. Therefore, a degree of freedom in installation location of each of these RFID tags is high, thereby achieving space saving.

Fifth Embodiment

Figure 20:
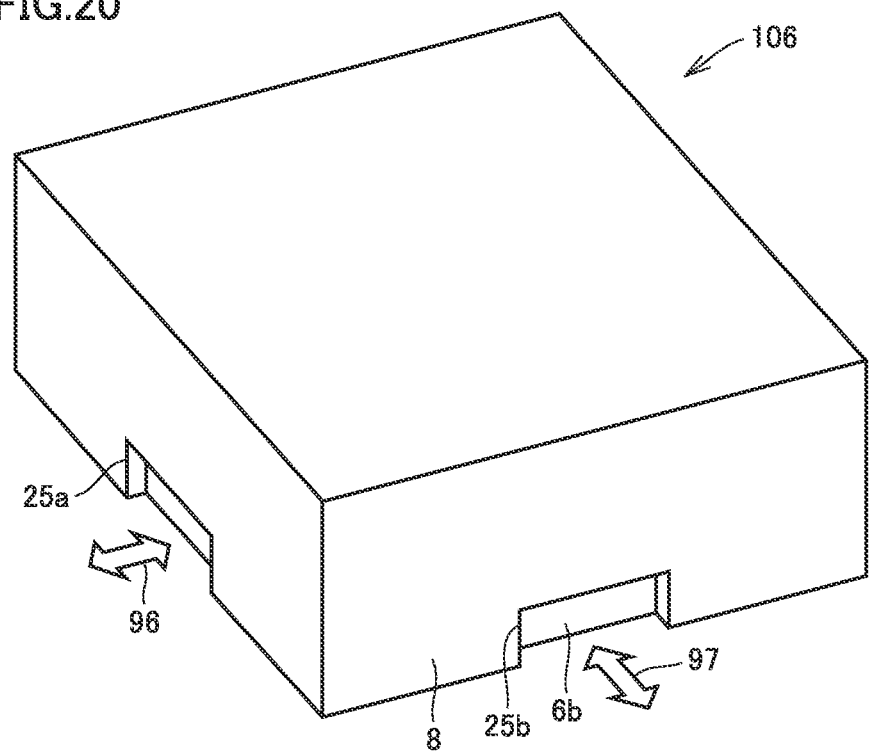
FIG. 20 is a perspective view of a module in a fifth embodiment according to the present disclosure.

A module in a fifth embodiment according to the present disclosure will be described with reference to FIG. 20. FIG. 20 shows a perspective view of a module 106 in the present embodiment. In module 106, shielding film 8 is provided with no opening in the upper surface of shielding film 8, is provided with a notch 25a in a first side surface of shielding film 8, and is provided with a notch 25b in a second side surface of shielding film 8. Thus, the module may have such a structure that no opening is provided in the upper surface thereof. The configurations of the other portions are the same as those described in the above embodiments. RFID tags included in module 106 are separated from each other by a shielding wall appropriately disposed.

Also, in the present embodiment, the same effect as those of the first embodiment and the like can be obtained. By selecting which side surface of module 106 is to be brought to be close to the reading device, communication relating to one purpose intentionally selected by the user can be performed.

Modification of Reading Device

Figure 21:
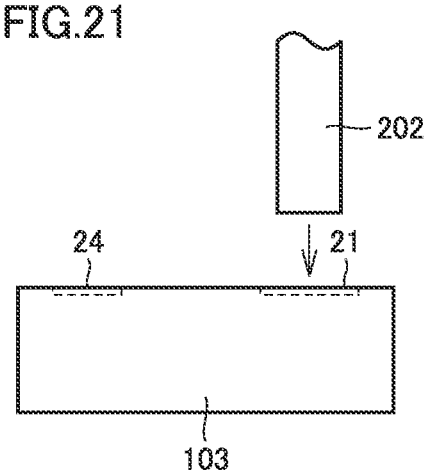
FIG. 21 is an explanatory diagram of a third usage example of the module in the second embodiment according to the present disclosure.
Figure 22:
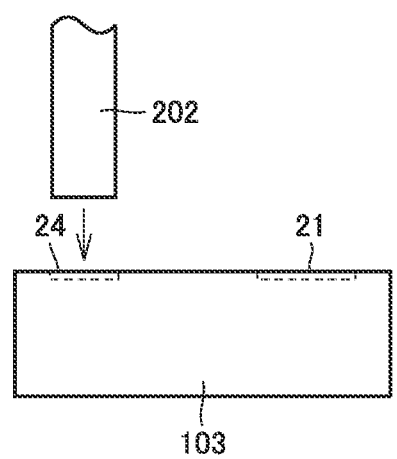
FIG. 22 is an explanatory diagram of a fourth usage example of the module in the second embodiment according to the present disclosure.

Each of FIGS. 5, 6, 11, and 12 shows the example in which reading device 201 is installed on a wall-like member; however, the reading device is not limited to this. For example, as shown in FIGS. 21 and 22, a pen-shaped reading device 202 may be employed. For example, in module 103 shown in the second embodiment, openings 21, 24 are formed in the upper surface of shielding film 8, and communication by the RFID tag corresponding to opening 21 can be performed when reading device 202 is brought to be close to opening 21 as shown in FIG. 21. When reading device 202 is brought to be close to opening 24 as shown in FIG. 22, communication by the RFID tag corresponding to opening 24 can be performed.

Although it has been illustratively shown that one module includes two RFIDs in each of the above embodiments, one module may include three or more RFIDs.

Further, each of the RFID tags may be an active type RFID tag rather than a passive type RFID tag. When the RFID tag is an active type RFID tag, a communication distance can be long because a battery is included in the RFID tag.

It should be noted that a plurality of embodiments from the above embodiments may be appropriately combined and employed. The embodiments disclosed herein are illustrative and non-restrictive in any respect. The scope of the present disclosure is defined by the terms of the claims, and is intended to include any modifications within the scope and meaning equivalent to the terms of the claims.

1: substrate; 1a: first main surface; 1b: second main surface; 3a, 3b: component; 4: adhesive agent; 5, 5i, 5j, 5k: shielding wall; 6a: first sealing resin; 6b: second sealing resin; 8: shielding film; 9: groove; 10: GND layer; 11: conductor layer; 21, 23, 24: opening; 22, 25: notch; 41, 42, 43: RFID tag; 45: first RFID tag; 46: second RFID tag; 90, 91, 92, 95, 96, 97: arrow; 101, 102, 103, 104, 105, 106: module; 201, 202: reading device.

The invention claimed is:

1. A module comprising:
a substrate having a first main surface;
a first sealing resin disposed to cover the first main surface;
a shielding film covering an upper surface and a side surface of the first sealing resin; and
two or more RFID tags sealed in the first sealing resin with the two or more RFID tags being not electrically connected to the substrate, wherein
the two or more RFID tags are disposed such that communication surfaces of the two or more RFID tags are oriented in different directions, and
the shielding film is provided with openings or notches at portions, each of the openings or notches facing a corresponding one of the communication surfaces of the two or more RFID tags.

2. The module according to claim 1, wherein the two or more RFID tags have the same corresponding frequency.

3. The module according to claim 2, wherein each of the RFID tags is a passive type RFID tag.

4. The module according to claim 1, wherein each RFID tag is a passive type RFID tag.

5. A module comprising:
a substrate having a first main surface;
a first sealing resin disposed to cover the first main surface;
a shielding film covering an upper surface and a side surface of the first sealing resin;
two or more RFID tags sealed in the first sealing resin with the two or more RFID tags being not electrically connected to the substrate; and
a shielding wall provided to stand on the first main surface between the two or more RFID tags, wherein
the shielding film is provided with an opening or notch at a portion facing each of communication surfaces of the two or more RFID tags.

6. The module according to claim 5, wherein the two or more RFID tags have the same corresponding frequency.

7. The module according to claim 5, wherein each of the RFID tags is a passive type RFID tag.

8. A module comprising:
a substrate having a first main surface and a second main surface, a GND layer being included in the substrate;
a first sealing resin disposed to cover the first main surface;
a second sealing resin disposed to cover the second main surface;
a shielding film covering at least an upper surface and a side surface of the first sealing resin and a side surface of the second sealing resin;
a first RFID tag sealed in the first sealing resin with the first RFID tag being not electrically connected to the substrate; and
a second RFID tag sealed in the second sealing resin with the second RFID tag being not electrically connected to the substrate, wherein
the first RFID tag and the second RFID tag are electromagnetically shielded from each other by the GND layer, and
the shielding film is provided with an opening or notch at a portion facing each of communication surfaces of the first RFID tag and the second RFID tag,
wherein a communication direction of the first RFID tag and a communication direction of the second RFID tag are perpendicular to each other.

9. The module according to claim 8, wherein the first RFID tag and the second RFID tag have the same corresponding frequency.

10. The module according to claim 9, wherein each of the first RFID tag and the second RFID tag is a passive type RFID tag.

11. The module according to claim 8, wherein each of the first RFID tag and the second RFID tag is a passive type RFID tag.

* * * * *